(12) United States Patent
Rodriguez et al.

(10) Patent No.: US 6,448,824 B1
(45) Date of Patent: Sep. 10, 2002

(54) METHOD AND APPARATUS FOR INTEGRATED CIRCUIT POWER UP

(75) Inventors: Pablo M. Rodriguez, Burlingame; Alper Ilkbahar, San Jose, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/676,728

(22) Filed: Sep. 29, 2000

(51) Int. Cl.⁷ .......................... H03K 5/153; H03K 17/22
(52) U.S. Cl. .......................... 327/74; 327/544; 327/143
(58) Field of Search ................................ 327/544, 143, 327/198, 77, 80, 81, 74, 333, 545, 546

(56) References Cited

U.S. PATENT DOCUMENTS 5,294,928 A  *  3/1994  Cooper et al. ............. 327/544
5,329,169 A  *  7/1994  Ihara .......................... 327/544
5,767,711 A  *  6/1998  Chevallier et al. ............ 327/77
6,078,201 A  *  6/2000  Crotty ......................... 327/143
6,215,342 B1 *  4/2001  Morrill ........................ 327/198

* cited by examiner

*Primary Examiner*—Toan Tran
(74) *Attorney, Agent, or Firm*—Blakely Sokoloff Taylor & Zafman LLP

(57) ABSTRACT

A circuit to detect predetermined power supply levels so that sufficient power is provided for an integrated circuit to function properly and drive a bus. A first circuit indicates whether a first voltage has reached a first level, a second circuit indicates whether a second voltage has reached a second level, and a third circuit causes the second circuit to operate in a low power mode when the second voltage has reached a predetermined level. The first voltage is provided by an I/O power supply and the second voltage is provided by a core power supply.

30 Claims, 5 Drawing Sheets

METHOD AND APPARATUS FOR INTEGRATED CIRCUIT POWER UP

FIELD

This invention relates to integrated circuit power up, more particularly, a circuit to detect predetermined power supply levels so that sufficient power is provided for an integrated circuit to function properly and drive a bus, the circuit operating in a low power mode when predetermined power supply levels are detected.

BACKGROUND

Computer systems typically include one or more processors. A processor manipulates and controls the flow of data in a computer. Typically, if a processor fails, the computer system fails. Processor failure may occur due to, for example, insufficient power being provided by one or more power supplies. That is, the magnitude of supply voltage can be below the minimum nominal operating voltage required by the processor.

Processors are presently designed to consume and require minimal power. When the Merced multiprocessor system powers up, voltage is supplied to each of the different integrated circuits on the bus. Since the Merced processor has dual power supplies, a core power supply having 1.1 volts and an input/output (I/O) power supply having 1.5 volts, it is necessary to ensure that both power supplies reach functional levels before enabling any Front Side Bus (FSB) functionality. If the voltage supplied to the Merced integrated circuit is insufficient for the integrated circuit to function properly, the integrated circuit must not drive the FSB because it would prevent other integrated circuits on the system and the system itself from functioning properly. A faulty core power supply could improperly drive the FSB pins, and a faulty I/O power supply could result in faulty integrated circuit behavior regardless of the state of the integrated circuit core. Although voltage sensors exist for detecting sufficient power supplies in the Deschutes phase locked loop (PLL) and in the Merced PLL, their low power modes (IDDQ) can result in sufficient power being incorrectly indicated while the core supply is inadequate. This invention ensures that power supplies, including both the core power supply and the I/O power supply reach sufficient levels before the Merced integrated circuit drives the FSB. The invention teaches disabling FSB pin driving until sufficient core power is detected, the detection provided by a circuit that can be disabled for low power operation when sufficient core power and I/O power is detected, and the circuit designed to meet high volume manufacturing standards.

DETAILED DESCRIPTION

Exemplary embodiments are described with reference to specific configurations. Those skilled in the art will appreciate that various changes and modifications can be made while remaining within the scope of the claims.

In accordance with an embodiment of the present invention, a multiprocessor computer system includes two or more processors that communicate with each other, as well as with the rest of the computer system, via I/O signals across a system bus. The computer system includes a[008e] I/O power supply that supplies power to each processor of the system . The I/O power supply provides the power used by the processors to drive the I/O signals on a system bus. The computer system additionally includes core power supplies, one for each processor of the multiprocessor system. The core power supplies provide the power used by the processor cores to perform signal processing.

Figure 1:
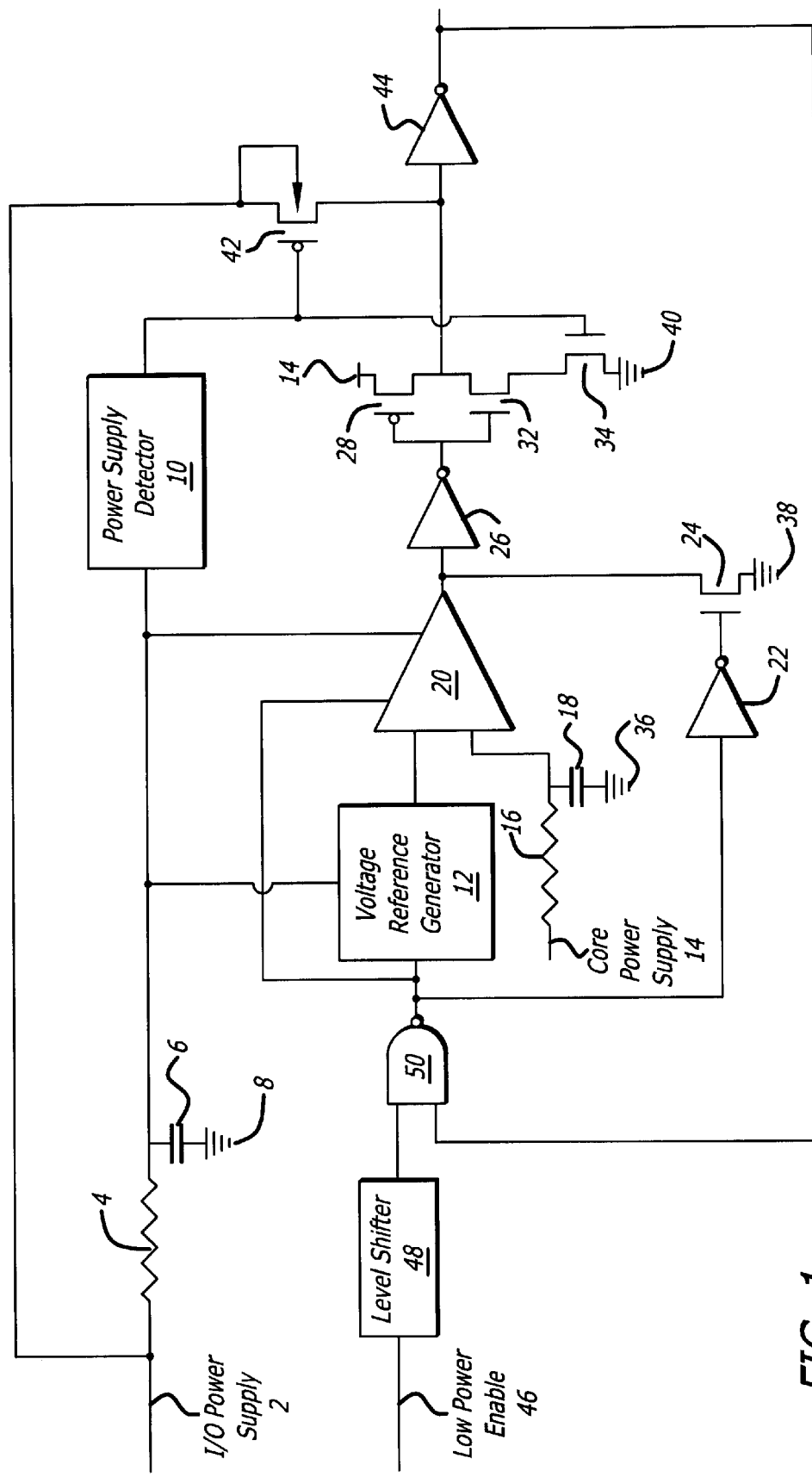
FIG. 1 is a circuit schematic functional diagram showing an embodiment of the present invention.

FIG. 1 depicts one embodiment of the invention. At power up, core power supply 14 and I/O power supply 1 are initially at ground and inverter output 44a indicates that core power supply 14 is insufficient. Core power supply 14 and I/O power supply 2 are filtered using a resistor and a capacitor (RC filter) having different component values. This filtering causes core power supply 14 to lag I/O power supply 2, when being ramped up from ground, to establish that I/O power supply 2 is sufficient before establishing that core power supply 14 is sufficient. Filtering also helps ensure flat there is no false indication that power is insufficient for the integrated circuit to function properly and drive a bus if either power supply is noisy. As I/O power supply 2 powers up, but before reaching a level sufficient to drive the FSB, transistor 42 is activated by I/O power supply detector 10, and current travels from the source to the drain of transistor 42. Being connected to transistor 42, inverter 44 receives a logic high from the drain of transistor 42 and outputs a logic low which indicates that core power supply 14 is not sufficient to drive the FSB. When I/O power supply 2 reaches a sufficient level to drive the FSB, I/O power supply detector 10 turns off transistor 42 and therefore inverter 44 receives a logic low from the drain of transistor 42. In one embodiment, I/O power supply detector 10 comprises a chain of diodes connected between I/O power supply and ground.

In one embodiment, the power up of core power supply 14 lags the power up of I/O power supply 2 and therefore in one state example, although I/O power supply 2 has reached a sufficient level to drive the FSB, core power supply 14 is not at a sufficient level to drive the FSB. Reference voltage generator 12 is enabled with I/O power supply 2 and is an input into differential amplifier 20. A second input into differential amplifier 20 is a filtered core power supply voltage 14. Differential amplifier 20 compares its two inputs and provides a logic low output into the input of inverter 26 if core power supply 14 is sufficient to drive the FSB, and provides a logic high output into the input of inverter 26 if core power supply 14 is insufficient to drive the FSB.

When a logic high is provided as an input into inverter 26, the output of inverter 26 activates transistor 28, and transistor 32 is set to off. Current from core power supply 14 travels from the source to the drain of transistor 28, and inputs a logic high into inverter 44. Inverter 44 then outputs a logic low, indicating core power supply 14 being insufficient to drive the FSB. If a logic low is provided as an input into inverter 26, the output of inverter 26 activates transistor 32, and transistor 28 is set to off. Since transistor 34 is activated by I/O power supply detector 10, the input of inverter 44 is grounded, inverter 44 then outputs a logic high indicating that core power supply 14 being sufficient to drive the FSB.

Figure 3A:
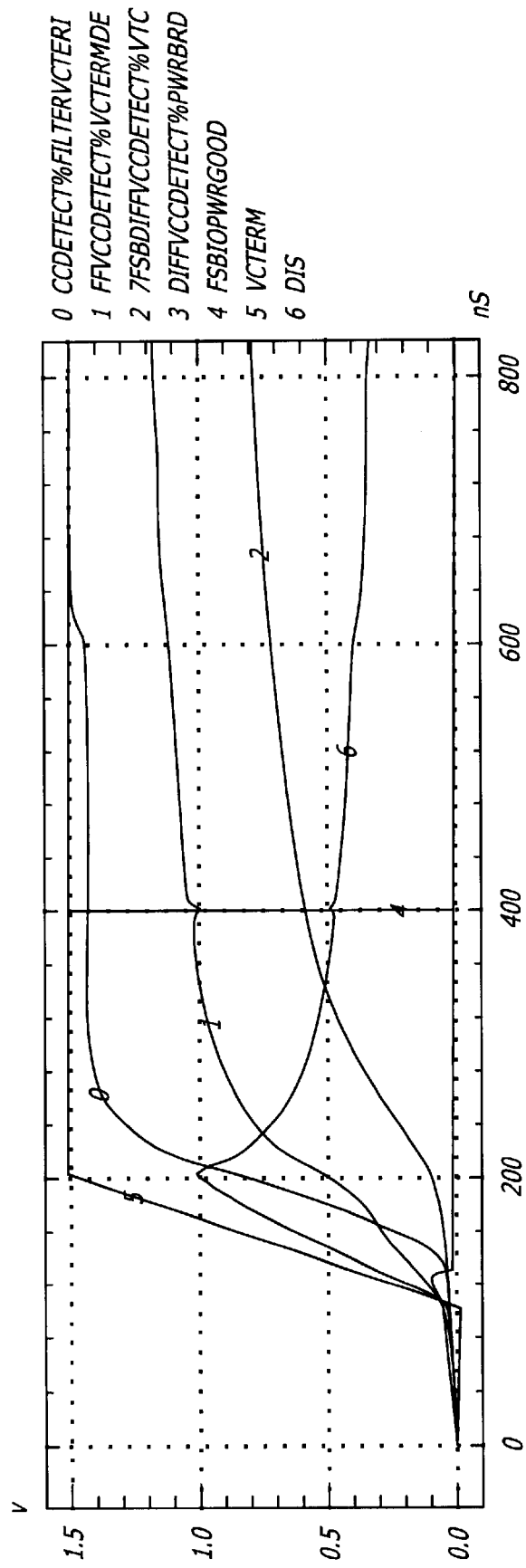
FIG. 3a depicts an I/O power supply being ramped-up and the bias of transistor 24 and transistor 42 over time in an embodiment of the present invention.
Figure 3B:
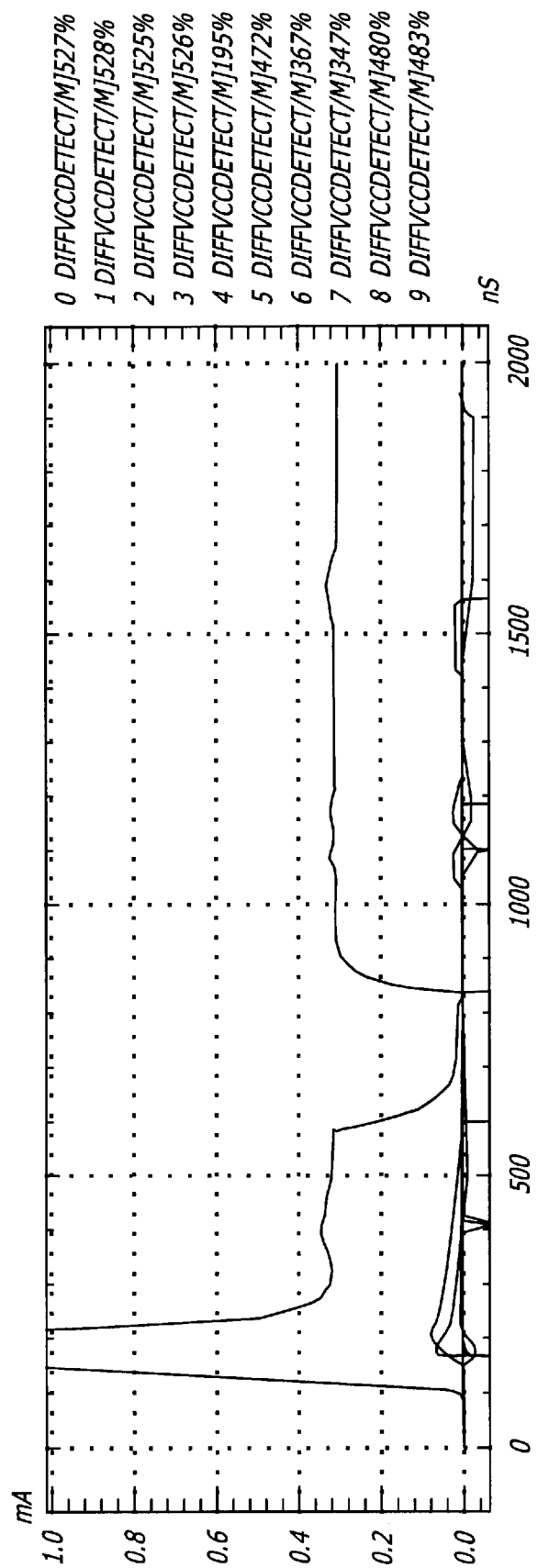
FIG. 3b depicts the total power consumption of the circuit over time, the integral of all the currents of the circuit, in an embodiment of the present invention.
Figure 3C:
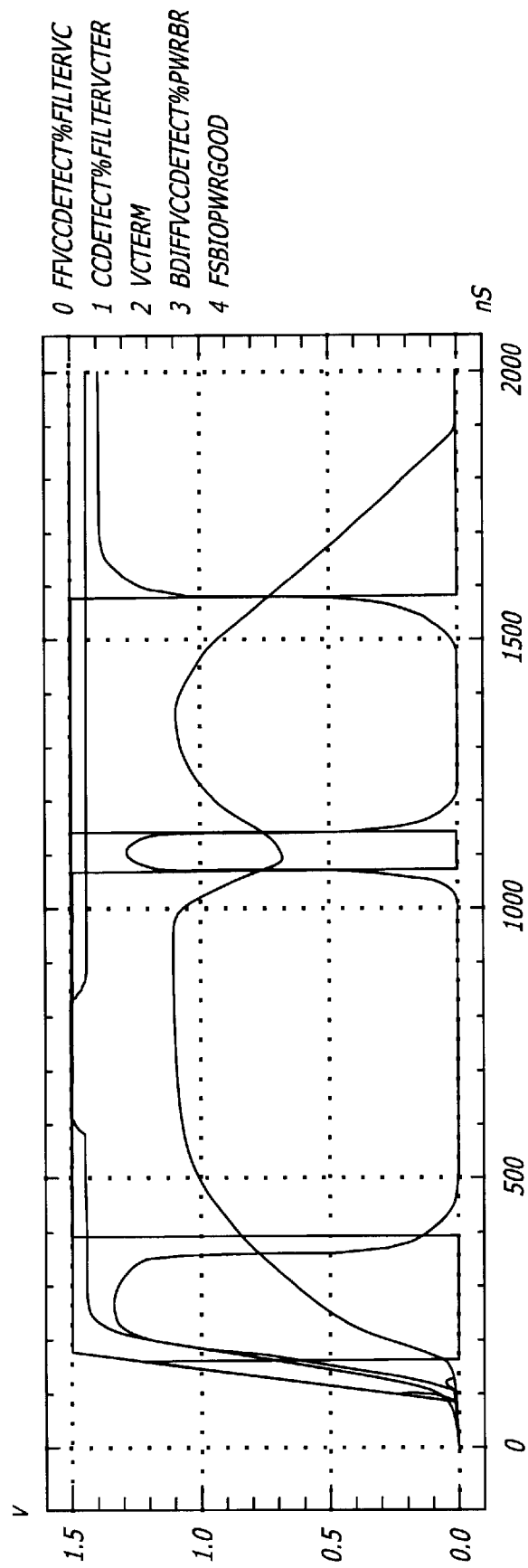
FIG. 3c depicts a power supply level response over time as the core power supply voltage rises and falls at power-up and after power up, in an embodiment of the present invention.

In one embodiment, a feedback is used from inverter 44 output to an input of logic NAND gate 50. Once inverter 44 outputs a logic high, and low power enable 46 provides a logic high, NAND gate 50 outputs a logic low to the input of inverter 22. Inverter 22 then outputs a logic high to the gate of transistor 24, activating transistor 24. The output of differential amplifier 20 is then grounded through transistor 24 causing the input into inverter 26 to be low and causing the output of inverter 44 to be high, indicating that core power supply 14 is sufficient to drive the FSB. Logic NAND gate 50 outputs a logic low when the output of inverter 44 outputs a logic high and low power enable 46 outputs a logic high. This ensures that sufficient power is detected from both core power supply 14 and I/O power supply 2 before driving the FSB. Additionally, when logic =NAND gate 50 outputs a logic low, reference voltage generator 12 and differential amplifier 20 are disabled. The signal from low power enable 46 is converted to the I/O power supply voltage domain from the core power supply voltage domain using level shifter 48. The decrease in power consumption in the low power mode is identifiable in FIG. 3b. All combinatorial logic is enabled by an unfiltered I/O power supply.

Figure 2:
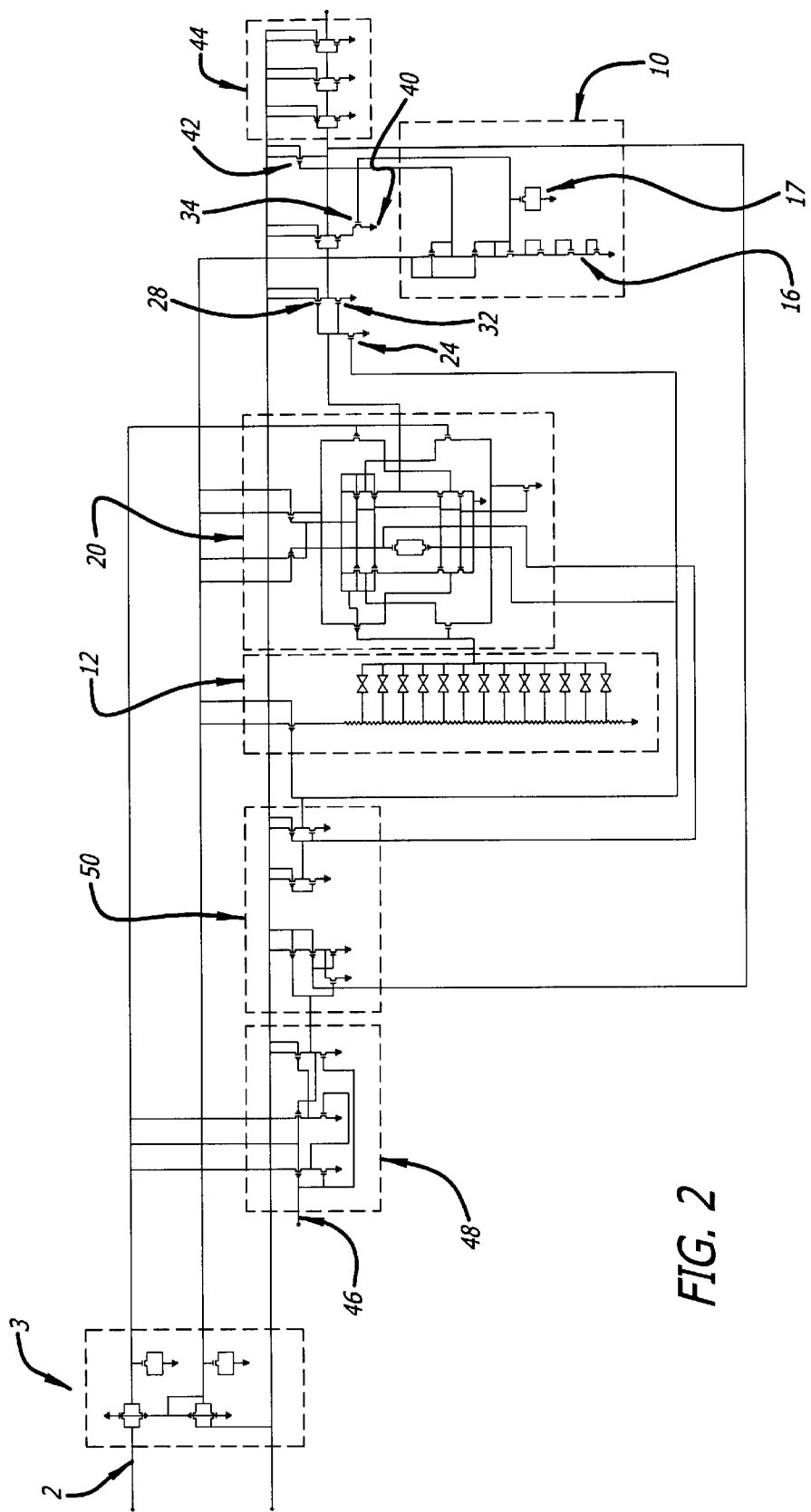
FIG. 2 is a circuit schematic showing an embodiment of the present invention.

FIG. 2 is a schematic diagram of an embodiment of the claimed subject matter. I/O power supply 2 is filtered through Filter 3 and which causes the core power supply to lag the I/O power supply 2. Level shifter 48 converts the low power enable signal 46 from the core power supply voltage domain to the I/O power voltage domain. Logic NAND gate 50 outputs a logic low when the output of inverter 44 is a logic high and the lower power enable output 46 is a logic high. Reference voltage generator 12 and differential amplifier 20 are disabled when logic NAND gate 50 outputs a logic low, If NAND gate 50 outputs a logic low, the logic low is input into inverter 22, which outputs a logic high to transistor 24.

As I/O power supply 2 powers up, but before reaching a level sufficient to drive the FSB, transistor 42 is activated by I/O power supply detector 10, and current travels from the source to the drain transistor 42. Inverter 44 outputs a logic low, indicating that core power supply 14 is insufficient to drive the FSB. In one embodiment, I/O power supply detector 10 comprises chain of diodes 16. I/O power supply detector 10 may also comprise transistor 17, in one embodiment of the claimed subject matter.

Having disclosed exemplary embodiments, modifications and variations may be made to the disclosed embodiments while remaining within the spirit and scope of the invention as defined by the appended claims.

What is claimed is:

1. An apparatus comprising:
    a first circuit to indicate whether a first voltage has reached a first predetermined level;
    a second circuit, coupled to said first circuit, to compare a second voltage to a second predetermined level and to indicate whether said second voltage has reached said second predetermined level; and
    a third circuit, coupled to said second circuit, to cause said second circuit to operate in a low power mode when said first voltage has reached said first predetermined level, said second voltage has reached said second predetermined level and a low power enable signal is activated.

2. The apparatus as in claim 1, wherein said first voltage is provided by a power supply.

3. The apparatus as in claim 1, wherein said first voltage is provided by an I/O power supply.

4. The apparatus as in claim 1, wherein said second voltage is provided by a power supply.

5. The apparatus as in claim 1, wherein said second voltage is provided by a core power supply.

6. The apparatus as in claim 1, wherein during power up of said first voltage and said second voltage, said second voltage lags said first voltage.

7. The apparatus as in claim 1, wherein said first circuit and said second circuit indicate whether predetermined power is available for an integrated circuit and to drive a bus.

8. The apparatus as in claim 1, wherein said first circuit comprises an RC circuit coupled on a first end to a source of said first voltage, and coupled on a second end to a detector of said first voltage.

9. The apparatus as in claim 8, wherein said first circuit comprises a chain of diodes connected between said first voltage source and ground.

10. The apparatus as in claim 1, said second circuit comprising:
    a second predetermined voltage level generator;
    a differential amplifier having a first input terminal coupled to said second predetermined voltage level generator and having a second input terminal coupled to a source of said second voltage level;
    a first inverter having a first terminal coupled to the input terminal of said second predetermined voltage level generator;
    a first transistor having a first current handling terminal coupled to said output terminal of said differential amplifier, a second current handling terminal coupled to ground, and a control terminal coupled to said second terminal of said first inverter;
    a second inverter having a first terminal coupled to said output of said differential amplifier;
    a second transistor having a first current handling terminal coupled to a source of said second voltage and having a control terminal coupled to a second terminal of said second inverter;
    a third transistor having a first current handling terminal coupled to a second current handling terminal of said second transistor and having a control terminal coupled to said second terminal of said second inverter;
    a fourth transistor having a first current handling terminal coupled to a second current handling terminal of said third transistor, having a second current handling terminal coupled to ground, and having a control terminal coupled to said first circuit; and
    a fifth transistor having a first current handling terminal coupled to a source of said first voltage, having a second current handling terminal coupled to said second current handling terminal of said second transistor, and having a control terminal coupled to said first circuit.
    a third inverter having a first terminal coupled to said second current handling terminal of said second transistor.

11. The apparatus of claim 1, said third circuit comprising:
    a low power enable signal generated by said second voltage;
    a level shifter coupled on a first terminal to said low power enable, to convert said low power enable signal to said first voltage level; and
    a logic NAND gate having a first input terminal coupled to a second terminal of said level shifter, having a second input terminal coupled to said second circuit, and having an output terminal coupled to an enable terminal of a generator of said second predetermined level.

12. The apparatus as in claim 11, wherein said coupling of said second input terminal of said logic NAND gate to said second circuit comprises a feedback loop to relay a logic output of said second voltage.

13. The apparatus as in claim 10, wherein when said second circuit operates in said low power, said second predetermined level is disabled, said differential amplifier is disabled, and said second circuit output is forced to indicate that said second voltage has reached said second predetermined level.

14. The apparatus as in claim 10, said first transistor, said second transistor, said third transistor, said fourth transistor, and said fifth transistor having a first state and a second state, said first state routing current from said first current handling terminal to said second current handling terminal, said second state being a nonconductive state.

15. A method comprising:
   indicating whether a first voltage has reached a first predetermined level;
   comparing a second voltage level to a second predetermined level and indicating whether said second voltage has reached said second predetermined level; and
   operating in a low power mode when said first voltage has reached said first predetermined level, said second voltage has reached said second predetermined level and low power is desired.

16. The method as in claim 15, comprising providing said first voltage by a power supply.

17. The method as in claim 15, comprising providing said first voltage by an I/O power supply.

18. The method as in claim 15, comprising providing said second voltage by a power supply.

19. The method as in claim 15, comprising providing said second voltage by a core power supply.

20. The method as in claim 15, comprising lagging said second voltage after said first voltage during power up of said first voltage and said second voltage.

21. The method as in claim 15, comprising indicating whether predetermined power is available for an integrated circuit and to drive a bus.

22. An apparatus comprising:
   a circuit to indicate whether a first voltage has reached a first predetermined level
   a means for comparing a second voltage level to a second predetermined level and indicating whether said second voltage has reached said second predetermined level; and
   a means for operating in a low power mode when said first voltage has reached said predetermined level, said second voltage has reached said second predetermined level and low power is desired.

23. The apparatus as in claim 22, comprising a means for providing said first voltage and said second voltage by a power supply.

24. The apparatus as in claim 22, comprising a means for lagging said second voltage after said first voltage during power up of said first voltage and said second voltage.

25. The apparatus as in claim 22, comprising a means for indicating whether predetermined power is available for an integrated circuit and to drive a bus.

26. An apparatus comprising:
   a first circuit to indicate that a first voltage of a first power supply has reached a first predetermined level;
   a second circuit to indicate that a voltage of a second power supply has reached a second predetermined level; and
   a third circuit coupled to the first circuit and the second circuit to prevent the apparatus from driving a bus until both the first voltage reaches the first predetermined level and the second voltage reaches the second predetermined level.

27. The apparatus of claim 26 wherein the first voltage lags the second voltage during power up.

28. The apparatus of claim 26 wherein the first circuit comprises:
   a chain of diodes connected between the first voltage and ground; and
   wherein the second circuit comprises a differential amplifier.

29. The apparatus as in claim 26, wherein said first power supply is an I/O power supply.

30. The apparatus as in claim 26, wherein said second power supply is a core power supply.

* * * * *

UNITED STATES PATENT AND TRADEMARK OFFICE
CERTIFICATE OF CORRECTION

PATENT NO. : 6,448,824 B1
DATED : September 10, 2002
INVENTOR(S) : Rodriguez et al.

It is certified that error appears in the above-identified patent and that said Letters Patent is hereby corrected as shown below:

Column 2,
Line 29, delete "flat", insert -- that --.

Signed and Sealed this

Eleventh Day of February, 2003

JAMES E. ROGAN
*Director of the United States Patent and Trademark Office*